(12) United States Patent
Kim et al.

(10) Patent No.: US 9,877,392 B2
(45) Date of Patent: Jan. 23, 2018

(54) PCB CAPACITOR VARIABLE DEVICE AND METHOD

(71) Applicant: SAMSUNG ELECTRO-MECHANICS CO., LTD., Suwon-Si (KR)

(72) Inventors: Yu Sin Kim, Suwon-Si (KR); Sang Won Lee, Suwon-Si (KR); Jong Jin Lee, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 483 days.

(21) Appl. No.: 14/533,060

(22) Filed: Nov. 4, 2014

(65) Prior Publication Data
US 2015/0123492 A1    May 7, 2015

(30) Foreign Application Priority Data
Nov. 6, 2013  (KR) .......................... 10-2013-0134309

(51) Int. Cl.
*H01G 7/00*    (2006.01)
*H05K 1/16*    (2006.01)
*H05K 1/02*    (2006.01)

(52) U.S. Cl.
CPC ............ *H05K 1/162* (2013.01); *H05K 1/029* (2013.01); *H05K 1/0231* (2013.01); *H05K 2201/10053* (2013.01); *H05K 2201/10196* (2013.01)

(58) Field of Classification Search
None
See application file for complete search history.

(56) References Cited

U.S. PATENT DOCUMENTS

| 2003/0063427 | A1* | 4/2003 | Kunihiro | ............. H01F 17/0006 361/277 |
| 2008/0062052 | A1* | 3/2008 | Suzuki | .................... G01L 1/005 343/702 |

FOREIGN PATENT DOCUMENTS

KR    2002-0076694 A    10/2002

* cited by examiner

*Primary Examiner* — Jared Fureman
*Assistant Examiner* — Aqeel Bukhari
(74) *Attorney, Agent, or Firm* — NSIP Law

(57) ABSTRACT

There are provided PCB capacitor variable device and method. The PCB capacitor variable device includes: a PCB forming any parallel capacitor by disposing a dielectric layer between a first pattern and a second pattern; and a switch unit connected to a pattern of one of the capacitors to switch the pattern of one of the capacitors so as to control equivalent capacitance of the capacitor. According an exemplary embodiment of the present disclosure, the capacitor is implemented using the PCB pattern and the dielectric substance and therefore the miniaturization and weight lightening of the wireless communication system may be implemented. Further, according to an exemplary embodiment of the present disclosure, the capacitor may be selectively switched and therefore the optimized frequency required in the output of the amplification unit may be implemented.

6 Claims, 2 Drawing Sheets

PCB CAPACITOR VARIABLE DEVICE AND METHOD

CROSS-REFERENCE TO RELATED APPLICATION

This application claims the benefit of Korean Patent Application No. 10-2013-0134309, filed on Nov. 6, 2013, entitled "Variable Capacitance Device and Method Using PCB Capacitor" which is hereby incorporated by reference in its entirety into this application.

BACKGROUND

The present disclosure relates to PCB capacitor variable device and method.

A multilayered printed circuit board (PCB) is used in a field requiring an integrated technology, such as a wireless communication system, and the like. Further, an IC of a wireless communication system configured of an RF IC, an analog IC, a digital IC, and the like is integrated with an inductor and a capacitor which are passive devices. However, separately integrating a capacitor increases a die size and therefore a system may not be miniaturized and costs may be increased due to an additional process.

To solve the above problem, the related art alternately disposes copper clad laminates to connect the copper clad laminates through via holes, thereby implementing a capacitor pattern. However, the related art fixedly uses capacitance and therefore may not cope with a change in characteristics of the IC during a manufacturing process.

RELATED ART DOCUMENT

Patent Document (Patent Document 1) KR2002-0076694 A

SUMMARY

An aspect of the present disclosure may provide PCB capacitor variable device and method capable of implementing a capacitor using a PCB pattern and a dielectric substance and selectively switching the capacitor to implement an optimized frequency required in an output of an amplification unit.

According to an aspect of the present disclosure, a PCB capacitor variable device may include: a PCB forming any parallel capacitor by disposing a dielectric layer between a first pattern and a second pattern; and a switch unit connected to a pattern of one of the capacitors to switch the pattern of one of the capacitors so as to control equivalent capacitance of the capacitor.

The PCB capacitor variable device may further include: an amplification unit having an output varying by the switching.

The PCB capacitor variable device may further include: a reference signal generation unit outputting a signal of a phase opposite to a system frequency where the output of the amplification unit is optimized; and a mixing unit mixing the output of the amplification unit with an output of the reference signal generation unit.

The reference signal generation unit may include a phase shifter.

The PCB capacitor variable device may further include: a power sensing unit sensing an output of the mixing unit to make a control unit switch the switch unit.

The control unit may include a look-up table to store information on the switched capacitor and information on capacitance of the switched capacitor so as to switch the switch unit.

According to another aspect of the present disclosure, a PCB capacitor variable method may include: (A) generating a reference signal; (B) switching any PCB capacitor; (C) mixing an output of an amplification unit with an output of the reference signal; and (D) sensing whether an output of a mixing unit is 0.

In the step (B), the control unit may switch the capacitor and include a look-up table to store information on the switched capacitor and information on capacitance of the switched capacitor so as to switch the switch unit.

In the step (D), when the output of the mixing unit is not 0, the method may return to the step (B) to switch any other PCB capacitor.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
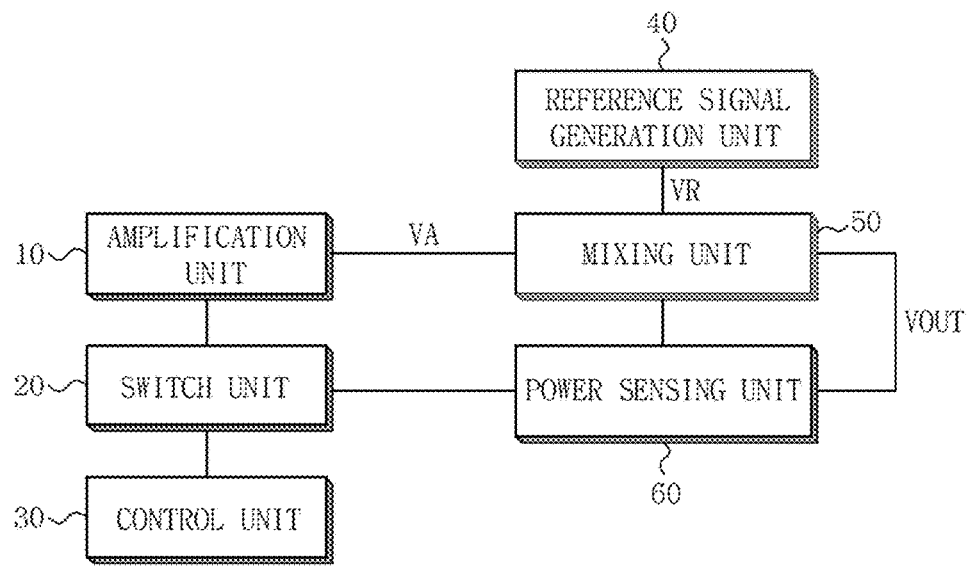
FIG. 1 is a block diagram of a PCB capacitor variable device according to an exemplary embodiment of the present disclosure.

The objects, features and advantages of the present disclosure will be more clearly understood from the following detailed description of the exemplary embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present disclosure, when it is determined that the detailed description of the related art would obscure the gist of the present disclosure, the description thereof will be omitted.

Hereinafter, exemplary embodiments of the present disclosure will be described in detail with reference to the accompanying drawings.

FIG. 1 is a block diagram of a PCB capacitor variable device according to an exemplary embodiment of the present disclosure.

Referring to FIG. 1, a PCB capacitor variable device according to an exemplary embodiment of the present disclosure includes an amplification unit 10, a switch unit 20, a control unit 30, a reference signal generation unit 40, a mixing unit 50, and a power sensing unit 60.

The amplification unit 10 may be an RF amplifier including a transistor device and a passive device. When an input signal is input to an input terminal of the amplification unit 10, an output signal VA is amplified in and output from an output terminal of the amplification unit 10. The output VA needs to be satisfied with an optimized frequency and size to meet a system frequency.

Meanwhile, a PCB capacitor may be included in the amplification unit 10. Further, the PCB capacitor is disposed outside the amplification unit 10 and thus may be connected to an inside of the amplification unit 10. Further, the PCB capacitor is disposed avoiding parts having high integration such as an RF IC, an analog IC, and a digital IC and thus may also be connected to the inside of the amplification unit 10.

The switch unit 20 controls equivalent capacitance of the PCB capacitor. In detail, in the PCB forming any parallel capacitor by disposing a dielectric substance between a first pattern and a second pattern, a pattern of one of the capacitors is connected to the switch unit to be switched. The switch unit 20 may be implemented as a semiconductor device such as a transistor and is connected to the control unit 30 and the power sensing unit 60 to be able to perform a switching operation.

Next, the control unit 30 includes a controller, and the like to control the switching of the switch unit 20. Further, the control unit 30 includes a look-up table to store information on the switched capacitor and information on the capacitance of the switched capacitor, thereby controlling the switch unit 20.

In detail, the look-up table stores information on which PCB capacitor is switched and information on the capacitance of the PCB capacitor which is determined by a width w of a pattern of the switched PCB capacitor, a length l of the pattern, a distance h between the patterns, and a dielectric constant $\in$ of the dielectric substance. Further, the look-up table may store information on the output VA of the amplification unit, an output VR of the reference signal generation unit, and an output 5 of the mixing unit which are described below.

In particular, at the time of initial calibration in a wireless communication system, the related information is stored in the look-up table and thus at the time of being switched, a trial and error to implement the optimized capacitance may be reduced.

The reference signal generation unit 40 outputs a signal of a phase opposite to the system frequency where the output VA of the amplification unit 10 is optimized.

In detail, the case in which the output VA of the amplification unit 10 is optimized is assumed to be VAOPT. The reference signal generation unit 40 generates a sinusoidal wave signal of VAOPT=K*sin (wt+θ) and then may generate an output of VR=−VAOPT=−K*sin(wt+θ) via a phase shifter. Here, a size of K may be, for example, 420 [mV].

The mixing unit 50 mixes the output VA of the amplification unit and the output VR of the reference signal generation unit 40 and outputs VOUT which is the mixed output. The mixing unit 50 may use a mixer, in which the mixer may synthesize two signals to output a new signal. Therefore, the output of the mixing unit 50 becomes VOUT=VA+VR.

Here, describing in more detail the output VOUT value of the mixing unit 50, as described above, the output of the reference signal generation unit 40 is a constant waveform as VR=−VAOPT=−K*sin(wt+θ). By the way, when the output VA of the amplification unit is not optimized, VA≠VAOPT. In this case, VOUT≠0 [V].

As such, when the output of the amplification unit is not optimized, the power sensing unit 60 senses the output VOUT of the mixing unit 50 and thus the control unit 30 may switch the switch unit 20. That is, the output of the amplification unit is optimized by switching any other PCB capacitor using another combination, not a combination such as any previous PCB capacitor.

As described above, when VA is optimized to be equal to VAOPT by switching any other PCB capacitor, VOUT=0 [V]. Further, even when the output VA of the amplification unit 10 approaches the VAOPT and thus the output VOUT of the mixing unit approaches 0 [V], it may be considered that the output VA of the amplification unit 10 is optimized if being in a tolerable range.

Finally, the power sensing unit 60 senses the output VOUT of the mixing unit 50 to transfer a signal so that the control unit 30 switches the switch unit 20.

Figure 2:
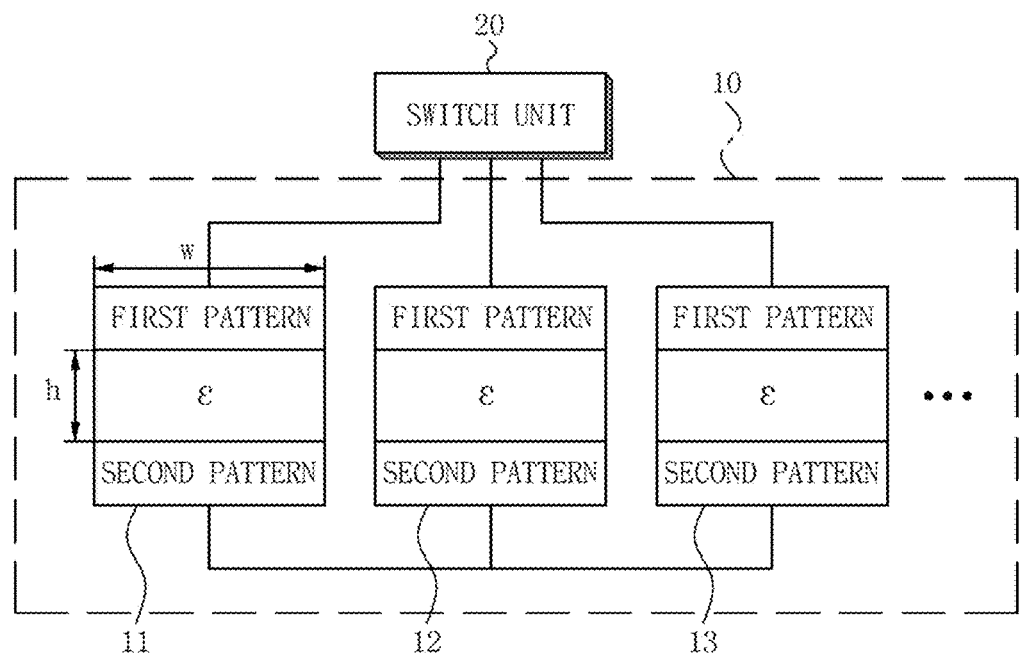
FIG. 2 is an exemplified diagram of the PCB capacitor variable device according to an exemplary embodiment of the present disclosure.

FIG. 2 is an exemplified diagram of the PCB capacitor variable device according to an exemplary embodiment of the present disclosure.

Referring to FIG. 2, a PCB capacitor such as a first capacitor 11, a second capacitor 12, and a third capacitor 13 may be included in the amplification unit 10. Further, it is already described that the capacitors may be disposed outside the amplification unit 10. A structure in which the PCB capacitor is formed based on the first capacitor 11 will be described below.

The dielectric substance having a dielectric constant $\in$ may be prepreg but is not limited thereto. An upper copper clad pattern which is the first pattern and a lower copper clad pattern which is a second pattern are disposed, having the dielectric substance therebetween. Further, the patterns may be a combination of a power pattern, a signal pattern, a ground pattern, and the like.

The PCB having the above structure serves as a capacitor and capacitance may be represented by the following Equation.

$$C = \in wl/h$$

In the above Equation, $\in$ represents a dielectric constant of an insulator, w represents a width of the pattern, l represents a length of the pattern (FIG. 2 is a cross-sectional view illustrating the capacitors and does not illustrate the length of the pattern), and h represents a distance between the patterns. As such, the capacitance of the PCB capacitor is in proportion to the width of the pattern and the length of the pattern and is in inverse proportion to the distance between the patterns.

Meanwhile, the second capacitor 12, the third capacitor 13, and the like also have the same structure as the first capacitor and therefore the detailed description thereof will be omitted. Further, $\in$, w, l, and h between the capacitors may be the same or different.

To switch the capacitors, the first patterns of the respective capacitors are connected to the switch unit 20. Further, the second patterns of the respective capacitors may be connected to a common point of contact. The common point of contact of the second patterns may be connected to other devices.

Similarly, the first patterns of the capacitors are connected to another device and the switch unit 20 may also be disposed between the first pattern and another device.

This describes an example of physically implementing the capacitor and therefore the capacitor is appropriately changed by a person having ordinary skill in the art to which the present disclosure pertains and thus may be designed to be physically implemented within the system.

Further, the capacitors are connected in parallel, but may be combined in series connection and serial-parallel connection.

The capacitors are connected in parallel and therefore synthesis capacitance is a value which is obtained by adding each capacitance. In particular, when the PCB is a multi-layer, capacitance may be more various.

As described above, the plurality of PCB capacitors are disposed, and therefore the synthesis capacitance in response to the number of capacitors combined by the switching operation is various present. Therefore, the optimized capacitance may be implemented. In addition, when the switching operation is performed by storing the related information, for example, a kind of combined capacitors, e, w, l, h, and the like in the look-up table of the control unit 30, a trial and error to optimize the capacitance may be reduced.

Figure 3:
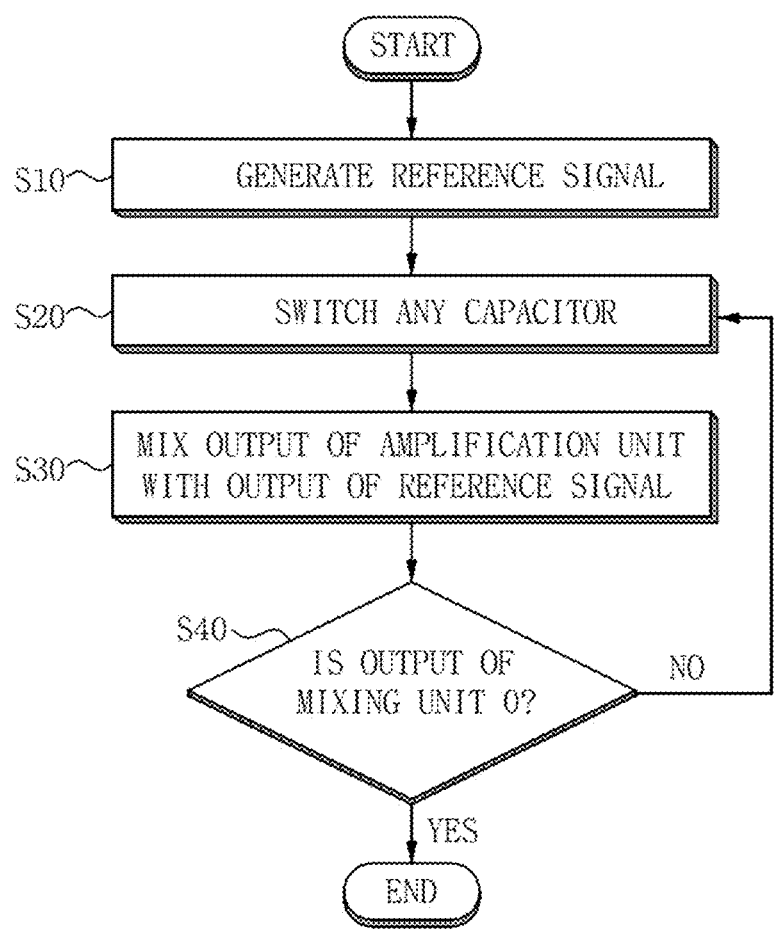
FIG. 3 is a flow chart of a PCB capacitor variable method according to an exemplary embodiment of the present disclosure.

FIG. 3 is a flow chart of a PCB capacitor variable method according to an exemplary embodiment of the present disclosure.

Referring to FIG. 3, the PCB capacitor variable method includes generating a reference signal (S10), switching any PCB capacitor (S20), mixing the output of the amplification unit with the output of the reference signal (S30), and sensing whether the output of the mixing unit is 0 (S40), thereby changing the PCB capacitor.

As described in connection with the reference signal generation unit 40, in the step S10, the frequency signal meeting the system is generated and thus the output VR is generated from the reference signal generation unit via the phase shifter.

Further, as described in connection with the amplification unit 10 and the switch unit 20 in FIGS. 1 and 2, in the step S20, any capacitor is switched. Any capacitor may be one or plural.

Further, the step S30 is performed by the mixing unit 50 and the mixing unit 50 may be, for example, a mixer.

Further, in the step S20, the control unit 30 switches the capacitor and includes the look-up table to store the information on the switched capacitor and the information on the capacitance of the switched capacitor, thereby switching the switch unit.

Meanwhile, in the step S40, when the output of the mixing unit is not 0 (or approaches 0), the method returns to the step S20 and thus steps after the step S20 may be repeated while any other PCB capacitors are switched. Here, switching any other PCB capacitor means being switched to a different combination from the previous switched capacitor.

As described above, according to an exemplary embodiment of the present disclosure, the capacitor is implemented using the PCB pattern and the dielectric substance and therefore the miniaturization and weight lightening of the wireless communication system may be implemented. Further, according to an exemplary embodiment of the present disclosure, the capacitor may be selectively switched and therefore the optimized frequency required in the output of the amplification unit may be implemented.

Although the embodiments of the present disclosure have been disclosed for illustrative purposes, it will be appreciated that the present disclosure is not limited thereto, and those skilled in the art will appreciate that various modifications, additions and substitutions are possible, without departing from the scope and spirit of the disclosure.

Accordingly, any and all modifications, variations or equivalent arrangements should be considered to be within the scope of the disclosure, and the detailed scope of the disclosure will be disclosed by the accompanying claims.

What is claimed is:

1. A PCB capacitor variable device, comprising:
a PCB having a plurality of capacitors formed therein; and
a switch unit configured to control equivalent capacitance by selectively connecting the plurality of capacitors in parallel,
an amplification unit having an output varying by the switching,
a reference signal generation unit outputting a signal of a phase opposite to a system frequency where the output of the amplification unit is optimized; and
a mixing unit mixing the output of the amplification unit with an output of the reference signal generation unit,
wherein patterns forming electrodes of the plurality of capacitors are connected to the switch unit, and
wherein the switch unit connects the plurality of capacitors in parallel by switching a connection between the patterns.

2. The PCB capacitor variable device of claim 1, wherein the reference signal generation unit includes a phase shifter.

3. The PCB capacitor variable device of claim 1, further comprising:
a power sensing unit sensing an output of the mixing unit to make a control unit switch the switch unit.

4. The PCB capacitor variable device of claim 3, wherein the control unit includes a look-up table to store information on the switched capacitor and information on capacitance of the switched capacitor so as to switch the switch unit.

5. The PCB capacitor variable device of claim 2, further comprising:
a power sensing unit sensing an output of the mixing unit to make a control unit switch the switch unit.

6. The PCB capacitor variable device of claim 5, wherein the control unit includes a look-up table to store information on the switched capacitor and information on capacitance of the switched capacitor so as to switch the switch unit.

* * * * *